United States Patent [19]
Letavic et al.

[11] Patent Number: 6,093,624
[45] Date of Patent: Jul. 25, 2000

[54] METHOD OF PROVIDING A GETTERING SCHEME IN THE MANUFACTURE OF SILICON-ON-INSULATOR (SOI) INTEGRATED CIRCUITS

[75] Inventors: Theodore J. Letavic, Putnam Valley, N.Y.; Rene P. Zingg, Nijmegen, Netherlands

[73] Assignee: Philips Electronics North America Corporation, New York, N.Y.

[21] Appl. No.: 08/996,672

[22] Filed: Dec. 23, 1997

[51] Int. Cl.[7] .................................. H01L 21/301
[52] U.S. Cl. .................. 438/462; 438/465; 438/476; 438/402
[58] Field of Search .................... 438/402, 400, 438/401, 164, 471, 476, 477, 460, 462, 465

[56] References Cited

U.S. PATENT DOCUMENTS

| | | |
|---|---|---|
| 4,610,079 | 9/1986 | Abe et al. . |
| 5,096,855 | 3/1992 | Vokdun, III . |
| 5,244,819 | 9/1993 | Yue .......................................... 438/476 |
| 5,308,776 | 5/1994 | Gotou ....................................... 438/471 |
| 5,429,981 | 7/1995 | Gardner et al. . |
| 5,556,793 | 9/1996 | Adler et al. .............................. 438/471 |
| 5,597,766 | 1/1997 | Neppl ...................................... 438/465 |
| 5,622,899 | 4/1997 | Chao et al. .................................. 438/9 |
| 5,646,053 | 7/1997 | Schepis et al. . |
| 5,726,082 | 3/1998 | Park et al. .............................. 438/165 |
| 5,892,292 | 6/1999 | Easter ...................................... 438/471 |

Primary Examiner—Savitri Mulpuri
Attorney, Agent, or Firm—Steven R. Biren

[57] ABSTRACT

A method of providing a gettering scheme in the manufacture of individual Silicon-On-Insulator (SOI) integrated circuits from an SOI wafer containing a number of such integrated circuits includes the steps of providing a gettering material in scribe lanes along which the SOI wafer is to be diced to obtain the individual SOI integrated circuits. The SOI wafer is then diced along the scribe lanes, leaving a portion of the gettering material on the diced edges of the individual integrated circuits. This method provides a simple and effective method for gettering in SOI technology in which diffusing impurities can be trapped before diffusing into the active area of the integrated circuits.

9 Claims, 2 Drawing Sheets

METHOD OF PROVIDING A GETTERING SCHEME IN THE MANUFACTURE OF SILICON-ON-INSULATOR (SOI) INTEGRATED CIRCUITS

BACKGROUND OF THE INVENTION

The invention is in the field of Semiconductor-On-Insulator (SOI) technology, and relates more particularly to a method of providing a gettering scheme in the manufacture of SOI integrated circuits.

Gettering, which uses specific techniques to prevent impurities or contaminants from reaching the active regions of integrated circuits, is a well-known technique for conventional semiconductor devices fabricated using conventional bulk silicon technology. Two representative techniques suitable for use in bulk silicon gettering are the use of polysilicon in direct contact with the back of the substrate wafer, and the use of phosphorus doping of contact layers to obtain topside gettering of diffused impurities or contaminants.

In SOI technology, however, the use of polysilicon in direct contact with the back of the substrate wafer is not an effective gettering scheme, since the buried oxide layer will act as a diffusion barrier, causing contaminants to become trapped in the SOI film. The use of topside gettering by phosphorus doping of contact layers is not effective in SOI technology due to the fact that it is necessarily applied late in the fabrication process and thus cannot prevent contamination during earlier stage of the process, and since it can only protect the top surface of the circuit, leaving access for contaminants from the die sides and back, especially in the finished encapsulation. The die sides of SOI circuits are particularly sensitive to contaminants, due to the oxide layers providing fast diffusion paths to some contaminants.

In the manufacture of SOI chips from an SOI wafer, one of the final process steps is to dice the wafer into individual die, each of which is packaged and provided with appropriate connections to form a completed integrated circuit. In order to perform the dicing step, the wafer is divided up, such as by sawing, along portions of the wafer commonly referred to as dicing rails, saw lanes or scribe lanes. However, when this dicing step is performed on SOI wafers in the prior art, the interface between the SOI layer and the underlying buried oxide layer on which it is formed is left unpassivated, and thus susceptible to diffusion of contaminants or impurities resulting from cutting, packaging and/or aging. Of particular concern is the interface between the active SOI layer and the underlying buried oxide, since several metallic ion impurity species will diffuse readily along this interface.

Accordingly, it would be desirable to have a method of providing a gettering scheme in the manufacture of individual SOI integrated circuits from an SOI wafer containing a number of such circuits which is both simple and effective.

SUMMARY OF THE INVENTION

It is therefore an object of the invention to provide a gettering method for manufacturing individual SOI integrated circuits from an SOI wafer which is both simple and effective. It is a further object of the invention to provide such a method in a cost-effective manner using techniques available in conventional process technology.

In accordance with the invention, these objects are achieved by a method of the type described above in which a gettering material is provided in scribe lanes along which the SOI wafer is to be diced to obtain the individual SOI integrated circuits, and then the SOI wafer is diced along the scribe lanes, leaving a portion of the gettering material on diced edges of the individual integrated circuits.

In a preferred embodiment of the invention, the gettering material is formed by oxidizing at least a portion of the silicon of the SOI wafer in the scribe lanes prior to dicing the SOI wafer along the scribe lanes.

In a further preferred embodiment of the invention, a portion of the silicon of the SOI wafer in the scribe lanes is oxidized to form a pattern of sunken silicon mesas which are separated by regions of oxidized silicon. These sunken (with respect to the oxide) mesas may be formed of undoped silicon or doped silicon, and may also contain regions of different conductivity types in order to more effectively getter different species of impurities.

In yet a further preferred embodiment of the invention, at least some of the sunken mesas may form elongated conductive tracks which can be connected to a source of potential.

These and other aspects of the invention will be apparent from and elucidated with reference to the embodiments described hereinafter.

BRIEF DESCRIPTION OF THE DRAWING

The invention may be more completely understood with reference to the following description, to be read in conjunction with the accompanying drawing, in which.

Figure 1:
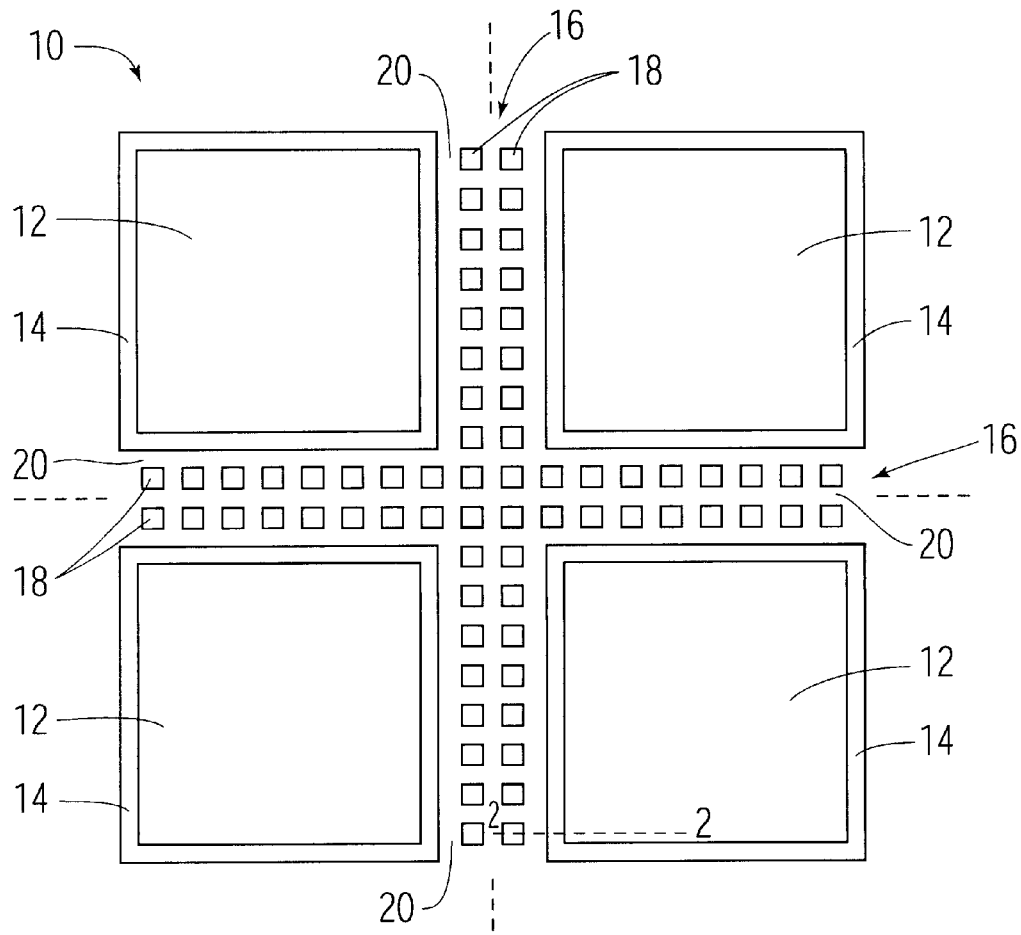
FIG. 1 shows a simplified plan view of a portion of an SOI wafer prior to dicing.

In the drawing, semiconductor regions having the same conductivity type are generally shown hatched in the same direction, and it should be understood that the figures are not drawn to scale.

DESCRIPTION OF THE PREFERRED EMBODIMENTS

In order to illustrate the method of the present invention, a portion of an SOI wafer 10 is shown in simplified form in FIG. 1. The SOI wafer contains a plurality of integrated circuits 12, four of which are shown in the figure, although it will be recognized that the wafer will in practice contain a larger number of integrated circuits. Each integrated circuit may be surrounded by a potential reference lane 14, which can be connected to ground or some other fixed potential in the finished integrated circuit. As noted above, in order to separate the wafer into the individual integrated circuits, the wafer is diced, typically by sawing, along scribe lanes 16.

In order to prevent contaminants or impurities from diffusing into the ICs along the edges of the scribe lanes, and particularly at the interface between the SOI layer and the buried oxide layer, the method of the present invention provides a gettering material in the scribe lanes 16, and then provides for dicing the SOI wafer along the scribe lanes, leaving a portion of the gettering material on diced edges of the individual integrated circuits.

In the embodiment shown in FIG. 1, gettering is achieved by providing a plurality of silicon mesas 18, separated by regions 20 of oxidized silicon. By selectively oxidizing the silicon material in the scribe lanes, such as by a standard LOCOS processing technique, a grid or pattern of sunken silicon mesas 18 separated by regions 20 of oxidized silicon are formed. As is well known in this art, the oxidation process causes strain fields associated with the volume expansion due to the oxidation of silicon and strain fields associated with differential thermal expansion are also created. These strain fields are strongest along the interfaces between the SOI material 18 and the oxidized silicon regions 20, and the invention uses the principle that such strain fields can serve as highly-effective traps for mobile impurities and contaminants, thus providing effective gettering sites for such contaminants and impurities which can diffuse from the scribe lane cut areas.

While it will be recognized that FIG. 1 shows a simplified representation of the method of the invention, for purposes of illustration, it should be understood that the method of the invention is not limited to the embodiment or configuration shown. Thus, the number, shape and position of the silicon mesas, the width of the scribe lanes, the spacing of the mesas, and the like can all be varied to suit particular design requirements.

In a particular illustrative example, the scribe lanes 16 can be about 60–160 microns wide, or about one or two times the width of a typical saw blade. A representative size for the sunken silicon mesas 18 can be about 10 microns square, with a center-to-center pitch for the mesas being in the order of 20–40 microns. The potential reference lane 14 may have a width of about 20 microns, and, in accordance with the invention, may be provided with mesas 18 in the same manner as shown in the scribe lanes 16, although the individual mesas are not shown within the potential reference lanes for clarity and simplicity.

Figure 2:
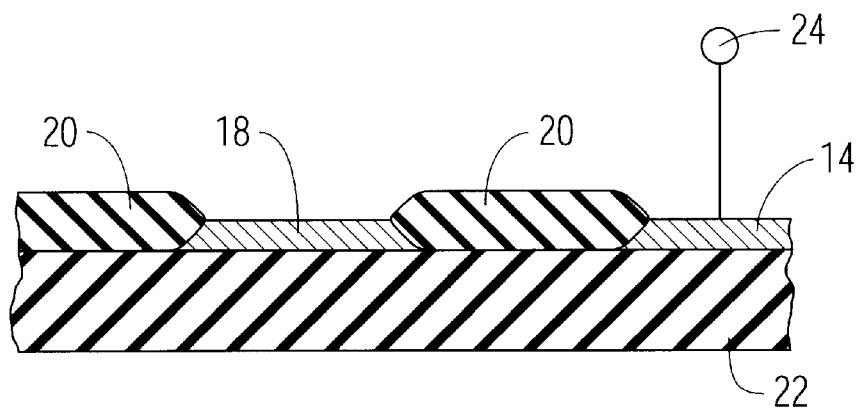
FIG. 2 shows a simplified cross-sectional view of a portion of the device shown in FIG. 1 taken along the line 2—2.

A simplified cross-sectional view taken along the line 2—2 in FIG. 1 is shown in FIG. 2. This figure shows, in simplified form, a sunken silicon mesa 18 on an insulator layer 22 and separated from other mesas by regions of oxidized silicon 20. Also shown in FIG. 2 is a portion of the potential reference lane 14, also formed in this embodiment as a plurality of spaced sunken silicon mesas in accordance with the invention, and provided with an electrical contact, symbolically shown by the connection line designated 24. As can be seen in FIG. 2, the regions of oxidized silicon 20 are higher than the silicon mesas 18 due to the volume expansion of silicon as a result of the oxidation process.

Figure 3:
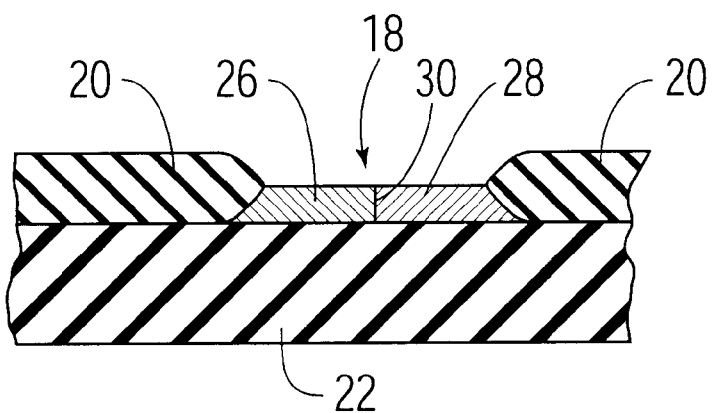
FIG. 3 shows a simplified cross-sectional view of an alternative embodiment of a portion of the device structure shown in FIG. 2.

It is within the scope of the present invention that the sunken silicon mesas 18 may be formed of various materials or combinations of materials. Thus, the mesas 18 may be formed of undoped silicon, doped silicon, or polysilicon. In addition, each sunken silicon mesa 18 may be formed of at least one region of n-type silicon and at least one region of p-type silicon, as shown by regions 26 and 28 in FIG. 3, with the regions 26 and 28 forming a p-n junction 30 at their intersection. Although the configuration of FIG. 3 is more complex than that of FIG. 2, it offers the additional advantage of improved gettering, in that different contaminants preferentially segregated out to either n-type or p-type semiconductor material. It is also possible to form each mesa with two regions of n-type silicon and two regions of p-type silicon in a checkerboard pattern, in which case the cross-section through a sunken silicon mesa 18 in a direction orthogonal to the direction of the cross-section of FIGS. 2 and 3 (i.e., in the vertical direction in FIG. 1) would also show two regions analogous to regions 26 and 28 in FIG. 3.

A further improvement in gettering performance may be achieved in accordance with the invention by connecting some or all of the silicon material in the scribe lanes 16 to a source of potential in order to prevent field-assisted migration of contaminant species from influencing the active regions of the integrated circuits. An electrical connection for providing such a source of potential to a silicon region is shown symbolically by electrical connection 24 to potential reference lane 14 in FIG. 2.

Figure 4:
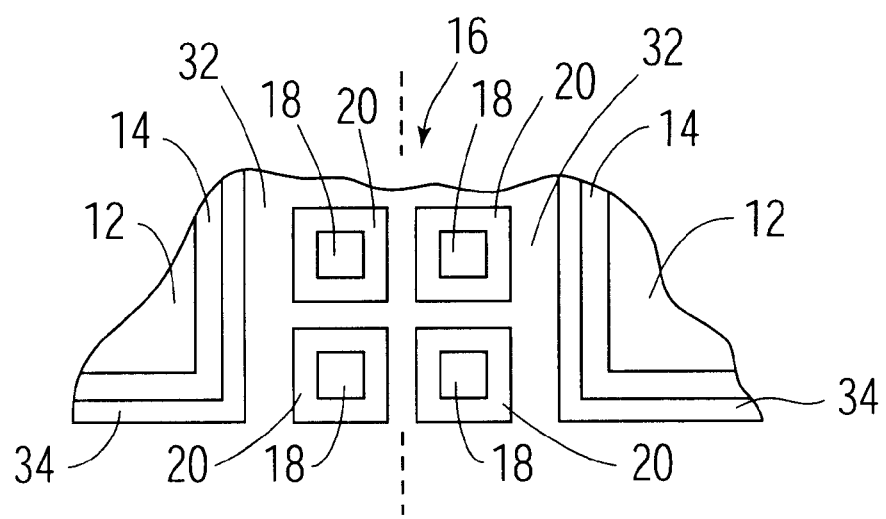
FIG. 4 shows a partial, enlarged plan view of an alternative embodiment of a portion of the device structure shown in FIG. 1.

In order to more efficiently and effectively connect the silicon material in the scribe lanes 16 to a source of potential, as discussed above, an alternative embodiment of the invention may be employed, as shown in the partial, enlarged plan view of FIG. 4. FIG. 4 shows a portion of an SOI wafer analogous to the lower-central portion of the SOI wafer 10 shown in FIG. 1. In the embodiment shown in FIG. 4, portions of two integrated circuits 12 are surrounded by potential reference lanes 14, as in FIG. 1. Also as in FIG. 1, the integrated circuits 12 are separated by scribe lanes 16 having a plurality of silicon mesas 18. However, in this embodiment, the silicon mesas 18 are separated by annular, rather than continuous, regions 20 of oxidized silicon. The oxidized silicon regions 20 are in turn surrounded by a substantially continuous region 32 of silicon, thus providing a substantially continuous conductive path along the scribe lanes to which an electrical connection such as the electrical connection 24 in FIG. 2 may be provided so that a source of potential may be applied to the regions 32 in order to improve gettering performance.

In order to electrically isolate the conductive potential reference lanes 14 from the conductive regions 32, annular rings of oxidized silicon 34 may be formed between potential reference lanes 14 and the silicon regions 32. It will be recognized that whereas the silicon mesas 18 are of a generally square or rectangular shape, the sunken silicon regions 32 will generally be in the form of elongated silicon mesas or tracks extended in the vertical or horizontal direction when viewed from above.

In this manner, the present invention provides a gettering scheme in the manufacture of individual SOI integrated circuits from an SOI wafer containing a number of such circuits which is both simple and effective.

While the invention has been particularly shown and described with reference to several preferred embodiments thereof, it will be understood by those skilled in the art that various changes in form and detail may be made without departing from the spirit or scope of the invention. Thus, for example, doped regions within the sunken silicon mesas may be formed by implantation or diffusion, and the regions of oxidized silicon may be formed by a LOCOS technique or other suitable oxidation process.

What is claimed is:

1. A method of providing a gettering scheme in the manufacture of individual Silicon-On-Insulator (SOI) integrated circuits from an SOI wafer containing a plurality of said integrated circuits, comprising providing a gettering material in scribe lanes along which the SOI wafer is to be diced to obtain the individual SOI integrated circuits, forming said gettering material by oxidizing a portion of the silicon of the SOI wafer in said scribe lanes prior to dicing the SOI wafer along said scribe lanes, and then dicing the SOI wafer along said scribe lanes, leaving a portion of said gettering material on diced edges of the individual integrated circuits.

2. A method of providing a gettering scheme as in claim 1, wherein a portion of said silicon of the SOI wafer is oxidized to form a pattern of sunken silicon mesas, the sunken mesas being separated by regions of oxidized silicon.

3. A method of providing a gettering scheme as in claim 2, wherein said sunken silicon mesas are formed of undoped silicon.

4. A method of providing a gettering scheme as in claim 2, wherein said sunken silicon mesas are formed of doped silicon.

5. A method of providing a gettering scheme as in claim 2, wherein said sunken silicon mesas are formed of polysilicon.

6. A method of providing a gettering scheme as in claim 2, wherein at least selected ones of said sunken silicon mesas form elongated conductive tracks which can be connected to a source of potential.

7. A method of providing a gettering scheme as in claim 2, wherein each integrated circuit is provided with a potential reference lane around its periphery and insulated from said pattern of sunken silicon mesas, and an electrical contact is provided to said potential reference lane.

8. A method of providing a gettering scheme as in claim 2, wherein said sunken silicon mesas are each formed of at least one region of n-type silicon and at least one region of p-type silicon, said regions forming at least one p-n junction within the sunken silicon mesas.

9. A method of providing a gettering scheme as in claim 8, wherein said sunken silicon mesas are each formed of two regions of n-type silicon and two regions of p-type silicon in a checkerboard pattern.

* * * * *